(12) United States Patent
Mineji

(10) Patent No.: US 6,492,218 B1
(45) Date of Patent: Dec. 10, 2002

(54) USE OF A HARD MASK IN THE MANUFACTURE OF A SEMICONDUCTOR DEVICE

(75) Inventor: Akira Mineji, Tokyo (JP)

(73) Assignee: NEC Corporation, Tokyo (JP)

( * ) Notice: Subject to any disclaimer, the term of this patent is extended or adjusted under 35 U.S.C. 154(b) by 48 days.

(21) Appl. No.: 09/680,716

(22) Filed: Oct. 6, 2000

(30) Foreign Application Priority Data

Oct. 6, 1999 (JP) ............................................. 11-284986

(51) Int. Cl.$^7$ ......................................... H01L 21/8238
(52) U.S. Cl. ........................ 438/199; 438/230; 438/232
(58) Field of Search ................................. 438/199, 223, 438/224, 227, 228, 229, 230, 231, 232

(56) References Cited

U.S. PATENT DOCUMENTS 5,741,725 A * 4/1998 Inoue et al. ................. 438/664
5,864,161 A * 1/1999 Mitani et al. ................ 257/347
5,940,699 A * 8/1999 Sumi et al. .................. 438/233

FOREIGN PATENT DOCUMENTS

JP 09167804 * 6/1997

* cited by examiner

Primary Examiner—Chandra Chaudhari
Assistant Examiner—Jack Chen
(74) Attorney, Agent, or Firm—Scully, Scott, Murphy & Presser

(57) ABSTRACT

A manufacturing method of a semiconductor device, in which a native oxide film on a silicon substrate is removed before ion implantation is performed, and a process that the surface of the silicon substrate is liable to be oxidized, such as a resist removing process, is not to be performed after the ion implantation, is provided. At a source/drain extension region forming process after a gate electrode is formed, a pMOS region is covered with a resist, and As or P is implanted to an nMOS region by low energy implantation. After removing the resist from the pMOS region, a cover insulation film with about 20 nm thickness is disposed on the whole surface of a silicon substrate. The cover insulation film only at the pMOS region is removed by etching back, and a thin film side wall is formed on the gate electrode of the pMOS region. By removing the resist at the nMOS region, a hard mask is formed at the nMOS region, this hard mask works as a mask at the nMOS region when pMOS extension is performed.

8 Claims, 5 Drawing Sheets

F I G. 2A
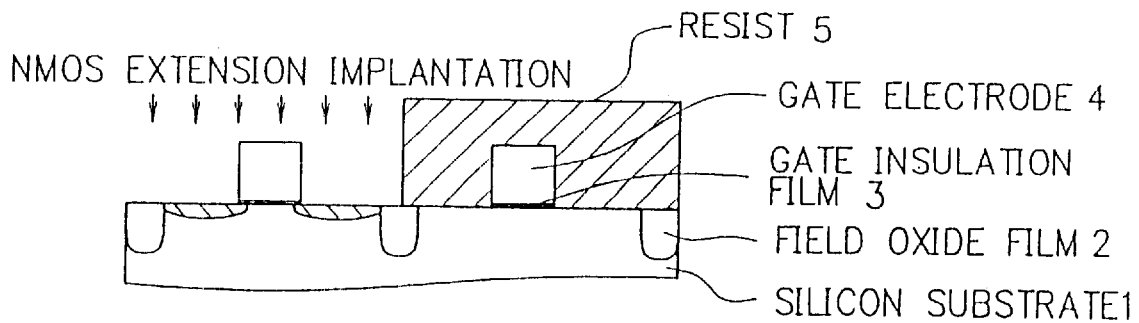
F I G. 2B
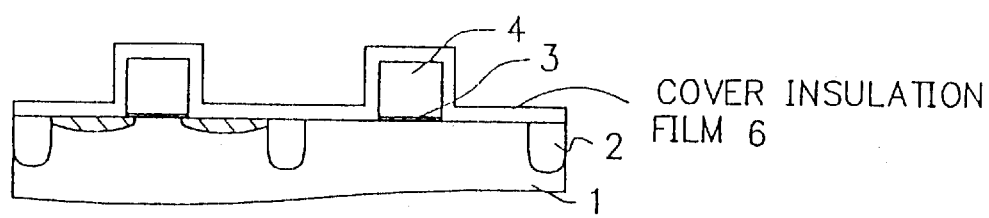
F I G. 2C1
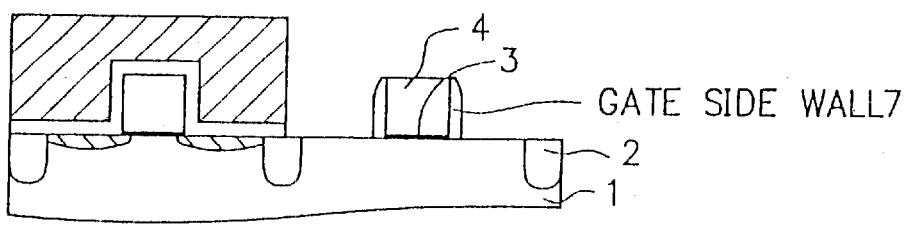
F I G. 2C2
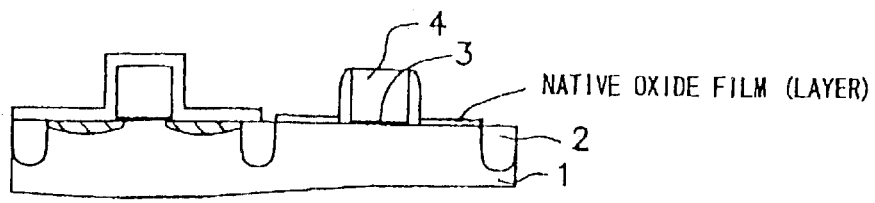

FIG. 3C1
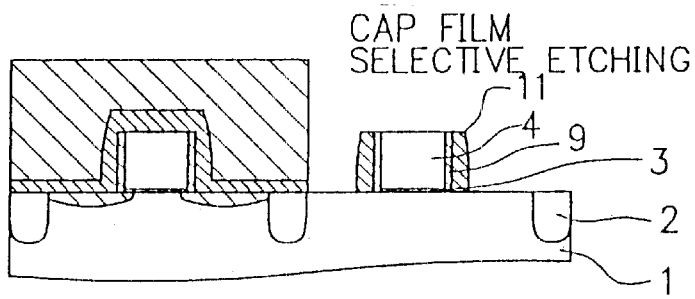
FIG. 3C2
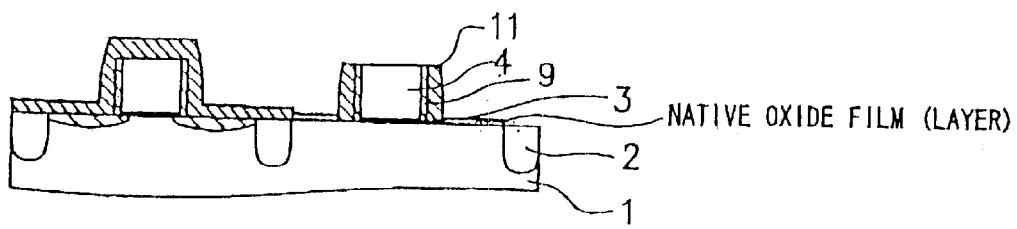
FIG. 3D
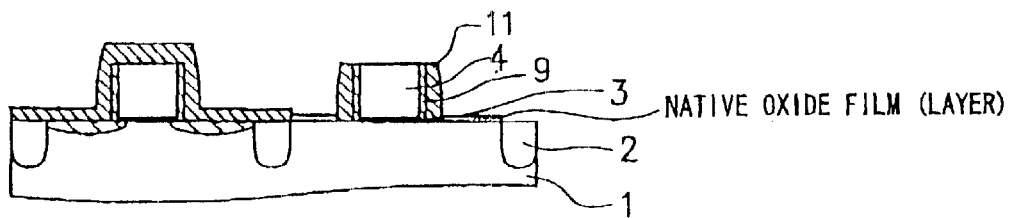
FIG. 3E
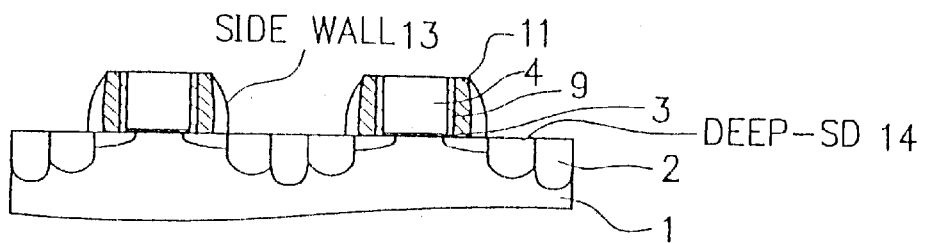

USE OF A HARD MASK IN THE MANUFACTURE OF A SEMICONDUCTOR DEVICE

BACKGROUND OF THE INVENTION

The present invention relates to a manufacturing method of a semiconductor device, in particular, a shallow extension diffusion layer forming method of a CMOS (complementary metal oxide semiconductor).

DESCRIPTION OF THE RELATED ART

Conventionally, in a shallow extension diffusion layer forming process of a CMOS, when about 0.5 keV is applied to implant boron ions, its projecting range of impurities (boron ions) is about 2 to 3 nm. And, in case that a native oxide film (1 to 1.5 nm) forming at the time of cleaning exists on a silicon substrate, a large number of boron ions are implanted to this native oxide film. Consequently, the number of impurities implanting to the silicon substrate becomes small.

And also it is recognized that the influence of transient enhanced diffusion appears caused by the existence of the native oxide film on the silicon substrate at the time of RTA (rapid thermal annealing). Therefore, in order to make the junction part shallow, it is desirable that the surface of the silicon substrate is exposed at the time of annealing without the native oxide film. The transient enhanced diffusion can be restrained by removing the native oxide film by applying an HF (hydrogen fluoride) treatment right before the RTA. However, at this time, the impurities implanted in the native oxide film of the silicon substrate are also removed. FIG. 1 is a graph showing characteristics at the time of removing the native oxide film in a process between the ion implantation and the RTA. As shown in FIG. 1, the large amount of dopant loss occurs, when the HF treatment is applied before the RTA. Therefore, it is necessary that the native oxide film must be removed before the time of the ion implantation.

And when the surface of the silicon substrate is oxidized at a process, such as a resist removing process, between the ion implantation process and the RTA process, the dopant loss also occurs. Therefore, it is necessary to omit processes in which the surface of the silicon substrate is liable to be oxidized, such as the resist removing process, after the ion implantation process.

SUMMARY OF THE INVENTION

It is therefore an object of the present invention to provide a manufacturing method of a semiconductor device, in which a native oxide film is removed before the time of ion implantation, and also processes in which the surface of the silicon substrate is liable to be oxidized, such as a resist removing process, can be omitted after the ion implantation.

According to the present invention for achieving the object mentioned above, in a manufacturing method of a semiconductor device, at a shallow extension diffusion layer forming process for manufacturing a CMOS (complementary metal oxide semiconductor), when ion implantation is performed to a pMOS region, a hard mask to prevent a dopant from the ion implantation to an nMOS region is used, and the hard mask is also used as a mask to restrain out diffusion of a dopant of the nMOS region.

According to the present invention, there is provided a manufacturing method of a semiconductor device at a shallow extension diffusion layer forming process for manufacturing a CMOS. At this manufacturing method, an HF treatment process for removing a native oxide film on a silicon substrate is performed before an ion implantation process for extension to a pMOS region is performed, and the ion implantation process is performed by using a hard mask made of at least an oxide film on an nMOS region, and before the ion implantation process is performed, a thin film side wall is formed on only a gate electrode of the pMOS region, and before an impurities activation RTA treatment to the pMOS region, a cap film being a hard mask to prevent out diffusion of impurities of the nMOS region is formed at the nMOS region, and the surface of the silicon substrate is exposed without a native oxide film at the pMOS region, in order to restrain transient enhanced diffusion.

According to the present invention, at the shallow extension diffusion layer forming process at the CMOS, in order to omit processes that cause a dopant loss and transient enhanced diffusion between an ion implantation process to a pMOS region and an RTA process, a hard mask is used at the time of the ion implantation. And the hard mask is also used as a mask to restrain the out diffusion of the dopant of the nMOS. Therefore, a dopant loss between the ion implantation to the pMOS region and the RTA process is restrained and also the transient enhanced diffusion can be restrained. With this, the native oxide film can be removed before the time of the ion implantation, and a process that the surface of the silicon substrate is liable to be oxidize, such as a resist removing process, can be omitted after the ion implantation.

BRIEF DESCRIPTION OF THE DRAWINGS

The objects and features of the present invention will become more apparent from the consideration of the following detailed description taken in conjunction with the accompanying drawings in which:

FIGS. 2A to 2D are sectional views of a semiconductor device showing a first embodiment of a manufacturing method of the semiconductor device of the present invention;

FIGS. 3A to 3E are sectional views of a semiconductor device showing a second embodiment of the manufacturing method of a semiconductor device of the present invention.

DESCRIPTION OF THE PREFERRED EMBODIMENTS

Figure 1:
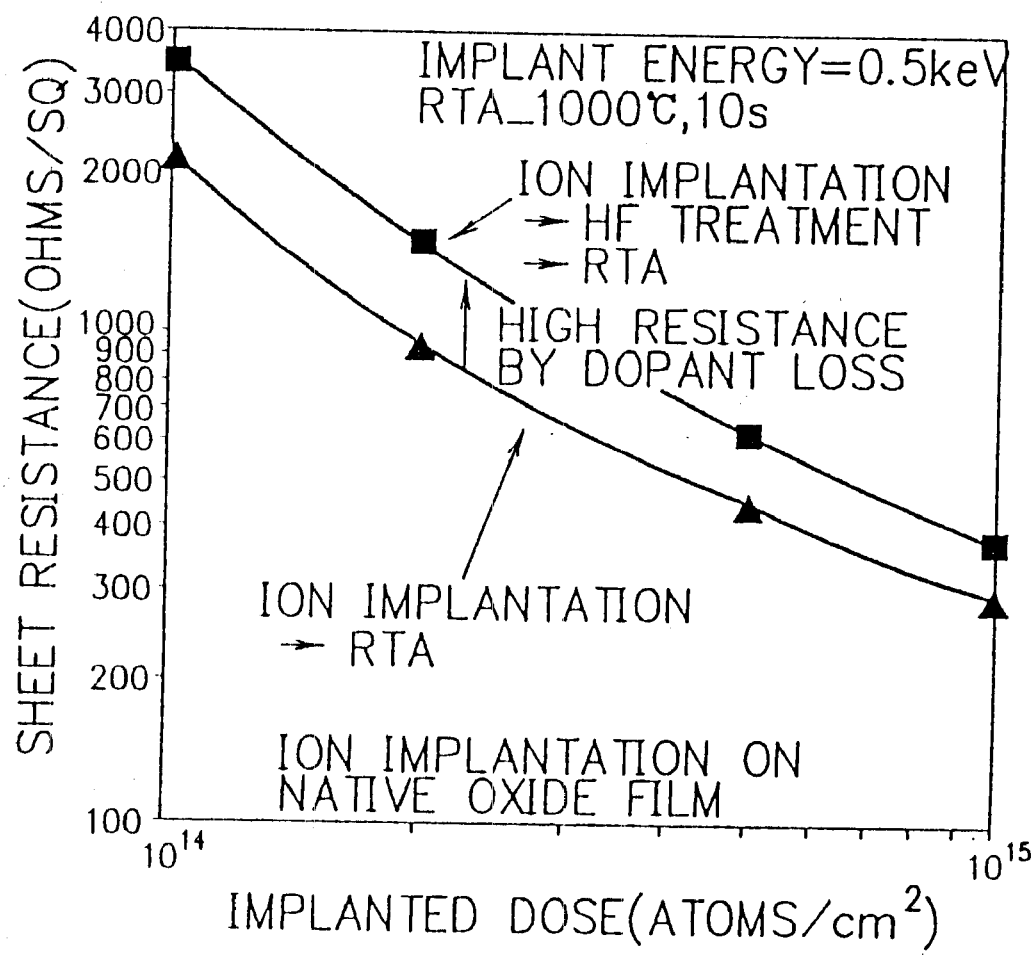
FIG. 1 is a graph showing characteristics at the time of removing the native oxide film in a process between ion implantation and an RTA.

Referring now to the drawings, embodiments of the present invention are explained in detail. FIGS. 2A to 2D are sectional views of a semiconductor device showing a first embodiment of a manufacturing method of the semiconductor device of the present invention. Referring to FIGS. 2A to 2D, the first embodiment of the present invention is explained.

First, a field oxide film 2 for separating elements is formed on a silicon substrate 1. And a gate insulation film 3 and a polycrystallin silicon film are formed in order, and a gate electrode 4 is formed by that pattering is applied to the formed film.

As shown in FIG. 2A, at a process forming a S/D (source/drain) extension region, first, a pMOS region is covered with a resist 5, and As or P is implanted to an nMOS region by low energy implantation.

And as shown in FIG. 2B, after removing the resist 5 at the pMOS region, a cover insulation film 6 made of, an oxide film, or a nitride film, or a film made of oxide and nitride films, with about 20 nm thickness is disposed on the silicon substrate.

And as shown in FIG. 2C1, the cover insulation film 6 at only the pMOS region is removed by etching back. And a gate side wall 7 made of a thin film for the gate electrode 4 at the pMOS region is formed. And the resist 5 at the nMOS region is removed, as shown in FIG. 2C2.

Figure 2D:
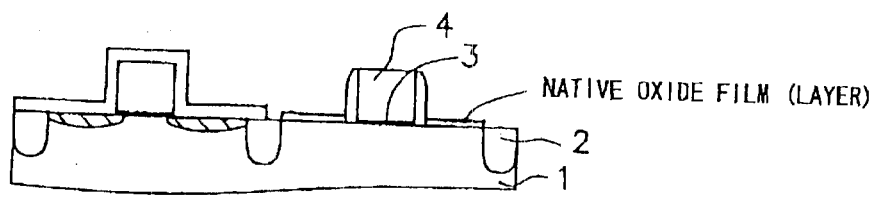

As shown in FIG. 2D, a hard mask 8 is formed on the nMOS region. This hard mask 8 works as a mask at the time when a pMOS extension is formed at the pMOS region by the ion implantation. In case that the film thickness of the hard mask 8 is about 20 nm, when boron ions are implanted by the implant energy of 0.5 keV, the hard mask 8 can be sufficiently used as a mask.

At the time right before pMOS extension implantation is performed, the native oxide film on the pMOS region is removed by the HF treatment. And ion implantation of B or $BF_2$ is performed to the pMOS region and an activation RTA is applied successively, with this, the impurities are activated and the S/D extension region is formed.

At the time when this activation RTA is applied, the nMOS region is covered with an insulation film being the hard mask 8, therefore, the out diffusion of the impurities can be restrained. And the native oxide film does not exist on the pMOS region at the time of the activation RTA, the transient enhanced diffusion of the impurities can be restrained. After this, a side wall (not shown) of about 100 nm thickness is formed on the gate side wall 7, and the S/D implantation is performed and the diffusion layer is made to be low resistance, and then a shallow extension diffusion layer of the CMOS is formed.

FIGS. 3A to 3E are sectional views of a semiconductor device showing a second embodiment of the manufacturing method of a semiconductor device of the present invention. Referring to FIGS. 3A to 3E, the second embodiment of the manufacturing method of a semiconductor device of the present invention is explained.

Figure 3A:
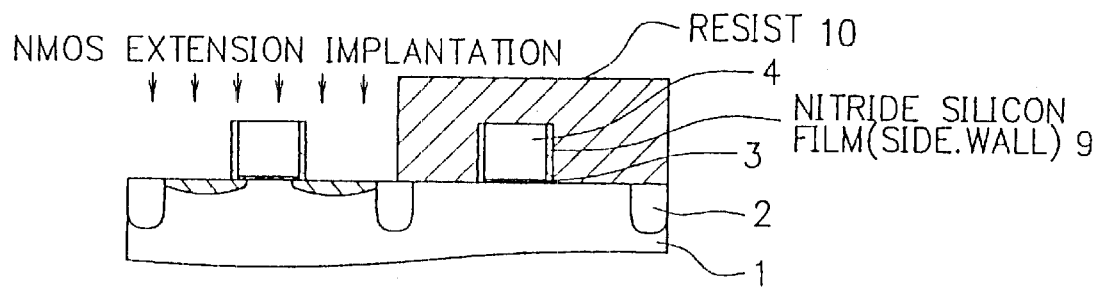

First, a field oxide film 2, a gate insulation film 3, and a gate electrode 4 are formed on a silicon substrate 1 in order. And as shown in FIG. 3A, a side wall 9 made of a nitride silicon film is formed on the gate electrode 4.

After this, a PMOS region is covered with a resist 10, and As ions or P ions are implanted to an nMOS region by a low implant energy. In order to prevent a dopant loss to a native oxide film at this ion implantation, the native oxide film on the nMOS region is removed by using an HF solvent (HF treatment) right before that the ion implantation is performed.

At this time, since the side wall 9 made of the nitride silicon film exists on the gate electrode 4, the erosion by the HF solvent to the gate insulation film 3 can be prevented. Therefore, the deterioration of the gate insulation film 3 can be restrained.

Figure 3B:
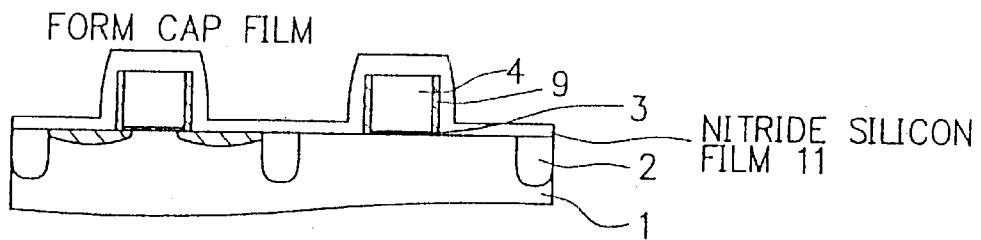

As shown in FIG. 3B, a nitride silicon film (cover) 11 being a thick film and becoming a mask for the nMOS region at the boron ion implantation to the pMOS region is formed on the whole surface. This nitride silicon film 11 is a cap film. After this, as shown in FIG. 3C1, only the pMOS region is etched back. With this, a hard mask 12 made of the nitride silicon film being a cover film on the nMOS region is formed, and at the same time, a side wall made of the nitride silicon film 11 on the gate electrode 4 of the pMOS region is formed. (FIG. 3C2).

Therefore, as shown in FIG. 3D, at a process that the native oxide film is removed by the HF treatment right before the ion implantation to the pMOS region, decreasing films by the HF treatment of the hard mask 12 on the nMOS region and of the side wall made of the nitride silicon film 11 of the pMOS region can be restrained. Consequently, the native oxide film can be removed effectively.

And since the diffusion of boron ions being dopant of the pMOS region is faster than that of As, a short channel occurs by that the diffusion of boron in the horizontal direction becomes large. However, this short channel can be prevented by that the side walls 9 and 11 are formed with a large width having a margin. Therefore, it becomes possible that a S/D extension region of the CMOS is formed effectively.

After this, as shown in FIG. 3E, side walls 13 are formed on the gate electrodes 4 of the nMOS region and the PMOS region, and Deep-SDs 14 are formed by the S/D implantation, and the resistance of the diffusion layer is made to be low. With these processes, the shallow extension diffusion layer of the CMOS is formed.

At the time when impurities activation annealing is applied to the extension region, the As or P being a dopant to the nMOS region is liable to be out diffusion, therefore, a cover film (the hard mask 12 at the nMOS region) must be formed at the time of annealing.

Figure 4:
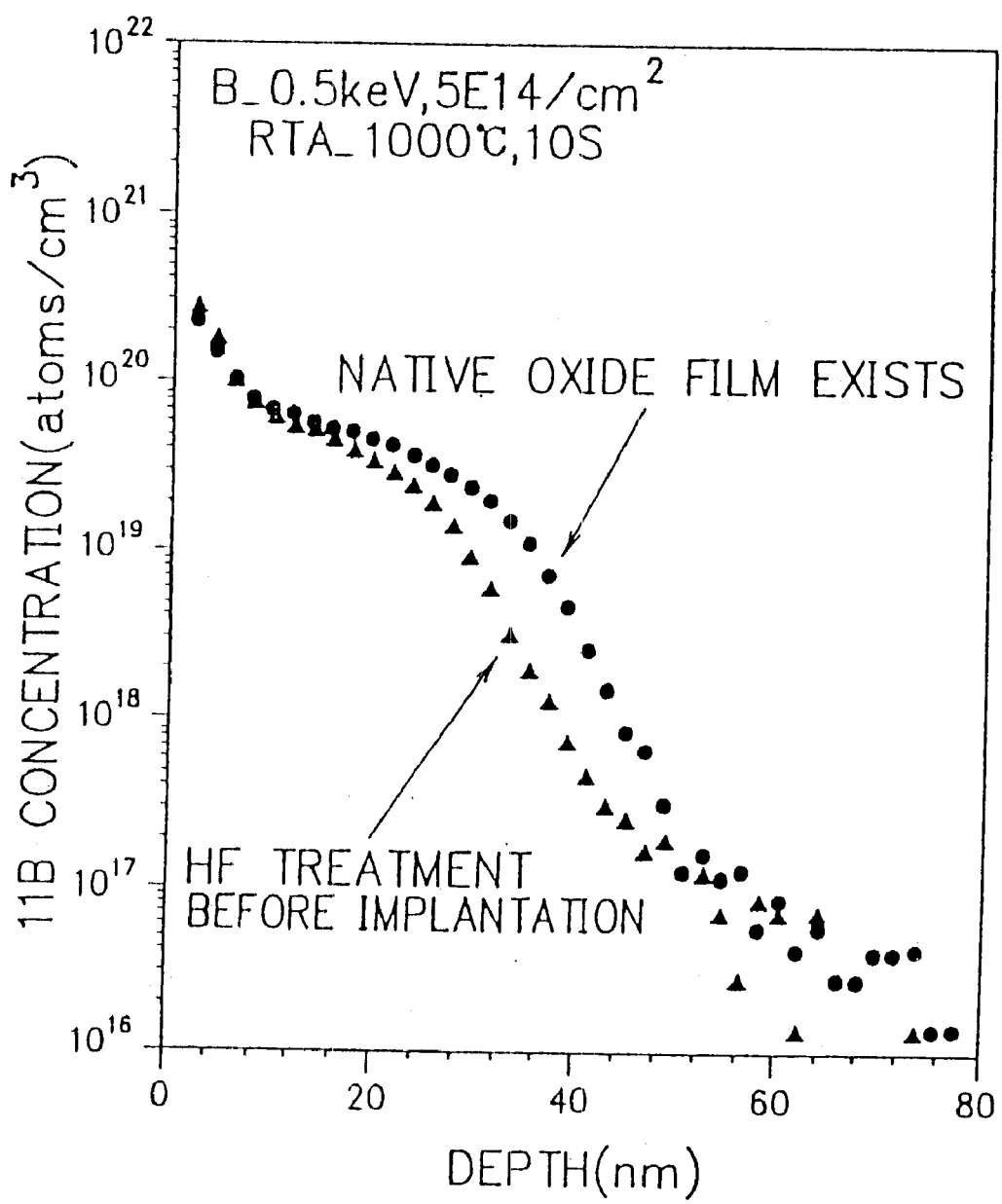
FIG. 4 is a graph showing an effect removed the native oxide film of the present invention.

FIG. 4 is a graph showing an effect removed the native oxide film of the present invention. As shown in FIG. 4, the B being the dopant of the pMOS region makes the junction part deep by not the influence of the out diffusion, but the transient enhanced diffusion of impurities caused by the existence of a film covered on the pMOS region. Therefore, it is important that even the native oxide film is not made to exist at the RTA.

As mentioned above, according to the present invention, at the shallow extension diffusion layer forming process at the CMOS, in order not to perform a processes that causes a dopant loss and transient enhanced diffusion between an ion implantation process to a PMOS region and an RTA process, a hard mask is used at the time of the ion implantation. And the hard mask is also used as a mask to restrain the out diffusion of the dopant of the nMOS. Therefore, the native oxide film can be removed before the time of the ion implantation, and a process that the surface of the silicon substrate is liable to be oxidize, such as a resist removing process, is not be performed after the ion implantation.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A manufacturing method of a semiconductor device comprised of a silicon substrate, a gate electrode, a gate insulation film and a native oxide film in a pMOS and a nMOS region, said method comprising
   (a) performing a shallow extension diffusion layer forming process for manufacturing a CMOS (complementary metal oxide semiconductor),
   (b) masking the n-MOS region with a hard mask and removing the native oxide film from p-MOS region,
   (c) performing an ion implantation at the p-MOS region, said hard mask preventing a dopant from said ion implementation entering an nMOS region and the diffusion of a dopant from said nMOS region.

2. A manufacturing method of a semiconductor device in accordance with claim 1, wherein:

said hard mask is an insulation film made of an oxide film, or a nitride film, or a film made of the oxide film and the nitride film.

3. A manufacturing method of a semiconductor device in accordance with claim 1, wherein:

before an ion implantation process for extension to said pMOS region, a native oxide film on a silicon substrate is removed by an HF (hydrogen fluoride) treatment.

4. A manufacturing method of a semiconductor device in accordance with claim 3, wherein:

before said HF treatment is performed to said pMOS region, a side wall made of a nitride silicon film is formed on a gate electrode of said pMOS region.

5. A manufacturing method of a semiconductor device in accordance with claim 1, wherein:

before ion implantation is performed to said pMOS region, a thin film side wall is formed on only a gate electrode of said pMOS region.

6. A manufacturing method of a semiconductor device in accordance with claim 5, wherein:

said thin film side wall is an insulation film made of an oxide film, or a nitride film, or a film made of the oxide film and the nitride film.

7. A manufacturing method of a semiconductor device in accordance with claim 1, wherein:

before an impurities activation RTA (rapid thermal annealing) treatment is performed, a cap film being said hard mask to prevent out diffusion of impurities of said nMOS region is formed at said nMOS region, and the surface of said silicon substrate is exposed without said native oxide film at said pMOS region, in order to restrain transient enhanced diffusion.

8. A manufacturing method of a semiconductor device comprised of a silicon substrate, a gate electrode, a gate insulation film and a native oxide film in a pMOS and a nMOS region, said method comprising a shallow extension diffusion layer forming process for manufacturing a CMOS, which comprises (a) forming a thin film sidewall on a gate electrode of said pMOS region, (b) masking said n-MOS region with a hard mask comprised of an oxide film;

(c) removing a native oxide film in pMOS region with HF;

(d) then performing ion implementation of the pMOS region;

(e) forming a cap film comprised of the hard mask on said nMOS region, said cap film preventing diffusion of impurities from said nMOS region and (f) effecting impurities activation RTA treatment to said pMOS region, whereby the surface of said silicon substrate is exposed without a native oxide film at said pMOS region, in order to restrain transient enhanced diffusion.

* * * * *